United States Patent
Bailey et al.

(10) Patent No.: US 6,400,186 B1
(45) Date of Patent: Jun. 4, 2002

(54) SETTABLE DIGITAL CMOS DIFFERENTIAL SENSE AMPLIFIER

(75) Inventors: Daniel W. Bailey, Northborough; Mark D. Matson, Acton, both of MA (US)

(73) Assignee: Compaq Information Technologies Group, L.P., Houston, TX (US)

( * ) Notice: Subject to any disclaimer, the term of this patent is extended or adjusted under 35 U.S.C. 154(b) by 0 days.

(21) Appl. No.: 09/296,013

(22) Filed: Apr. 21, 1999

(51) Int. Cl.$^7$ ............................................. G01R 19/00
(52) U.S. Cl. ..................... 327/55; 327/57; 327/198; 365/208; 365/189.11
(58) Field of Search ................. 327/50–57, 63, 327/64, 65, 198, 208, 210–215; 365/207, 208, 189.11, 205, 230.02, 230.03, 190

(56) References Cited

U.S. PATENT DOCUMENTS

| | | | |
|---|---|---|---|
| 4,910,713 A | 3/1990 | Madden et al. | 365/189.11 |
| 5,473,567 A | * 12/1995 | McClure | 365/208 |
| 5,854,562 A | * 12/1998 | Toyoshima et al. | 327/55 |

OTHER PUBLICATIONS

Chuang, Ching–Te et al., "SOI for Digital CMOS VLSI: Design Considerations and Advances," Proceedings of the IEEE, 86(4): 689–720 (Apr. 1998).

Glasser, Lance A., and Dobberpuhl, Daniel W., "The Design and Analysis of VLSI Circuits," (MA: Addison_Wesley Publishing), pp. 286–289 (1985).

Matson, M. et al., "A 600MHz Superscalar Floating Point Processor," Paper on EV6 Fbox given at European Solid–State Circuits Conference, (Sep. 1998).

Montanaro, James et al., "A 160–MHZ, 32–b, 0.5–W CMOS Risc Microprocessor," IEEE Journal of Solid–State Circuits, 31(11) 1703–1714 (Nov. 1996).

Jiang, June et al., "High–Performance, Low–Power Design Techniques for Dynamic to Static Logic Interface," Proceedings 1997 International Symposium on Low Power Electronics and Design, Monterey, CA, Aug. 18–20, 1997, pp. 12–17.

* cited by examiner

Primary Examiner—Timothy P. Callahan
Assistant Examiner—Minh Nguyen
(74) Attorney, Agent, or Firm—Hamilton, Brook, Smith & Reynolds, P.C.

(57) ABSTRACT

Set and reset functions are corporated in a sense amplifier such that those functions can be performed by the sense amplifier rather than by circuits connected to the sense amplifier. The set and reset functionality is added to the sense amplifier in a manner that minimally impacts the sense amplifier's performance. Accordingly, the sense amplifier includes a number of discharge paths for discharging charges that develop on its output terminals. The set and reset circuit includes a number of high conductance paths that are turned-on in response to an assertion of a set control signal or a reset control signal. When either of those control signals is asserted, the corresponding output terminal is discharged. Accordingly, the output terminals can be either set or reset, responsive to which of the control signals is asserted. When the control signals are de-asserted, the sense amplifier performs in a normal sense amplifier manner.

45 Claims, 15 Drawing Sheets

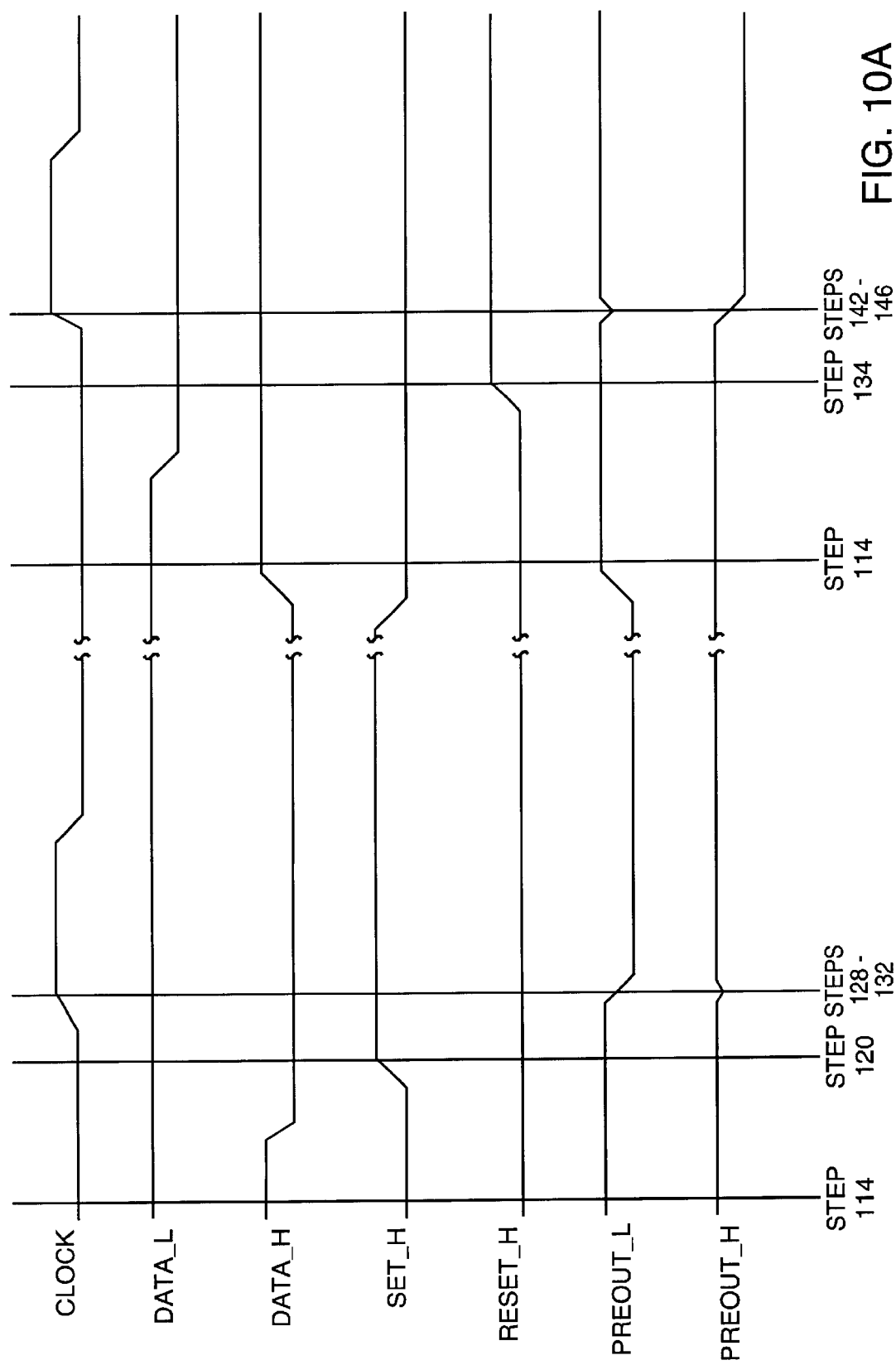

SETTABLE DIGITAL CMOS DIFFERENTIAL SENSE AMPLIFIER

BACKGROUND OF THE INVENTION

Generally speaking, computer systems typically include one or more central processor units (CPUs). Each CPU includes many signal paths that convey data between functional units that operate on that data. Such data is typically conveyed using a transfer cycle having a specified timing structure. That timing structure dictates a time period when the data to be transferred will be valid. Accordingly, the data is captured while it is valid and held for a specified amount of time. Such data capture can be performed using a number of edge triggered latches.

Within a CPU, edge triggered latches are commonly implemented using a circuit referred to as a "sense amplifier". Sense amplifiers are designed to sense the logic level of a data signal and to output a latched version of that logic level. Because the above mentioned time period is typically specified with respect to a particular clock cycle, an edge triggered latch typically samples or "senses" the data on the rising edge of that clock cycle. The data is latched, i.e. held at the output of the sense amplifier, until the falling edge of that clock cycle or until the rising edge of the next clock cycle, depending upon its design. Until the next rising edge of the clock, new data can be asserted on the signal line without affecting the latched data.

Logic circuits are typically connected to the input or output terminals of sense amplifiers such that a logic function is performed on the logic levels developed thereon. For example, logic circuits are typically connected to the input terminals of sense amplifiers to implement set and reset functions. In other words, those logic circuits cause the output terminals of the sense amplifier to develop logic high (set) or logic low (reset) levels in response to a pre-determined set of logic conditions.

One such logic circuit is a multiplexer circuit. The combination of a multiplexer and a sense amplifier is referred to as a "multiplexing differential sense amplifier" or a mux latch. A mux latch senses the logic levels of data signals that are connected to its input terminals. A number of control signals are connected to the mux latch that indicate which of those input data signals is to have its logic level latched at the output of the sense amplifier.

In a typical mux latch configuration, a logic high level is permanently developed on a first data signal and a logic low level is permanently developed on a second data signal. When a first pre-determined set of logic conditions is encountered, the control signals indicate that the logic high level of the first data signal should be latched at the output of the sense amplifier. Accordingly, the logic high level is output from the multiplexer and latched at the output terminal of the sense amplifier, thereby setting it. Alternatively, when a second pre-determined set of logic conditions is encountered, the control signals indicate that the logic level of the second data signal should be latched at the output of the sense amplifier. Accordingly, the logic low level is output by the multiplexer and latched at the output terminal of the sense amplifier, thereby resetting it.

The use of a mux latch arrangement to set and reset the output terminals of a sense amplifier is not desirable. Such a mux latch typically includes a high input loading characteristic, develops a large amount of parasitic capacitance that affects the performance of the attached sense amplifier and includes inherent charge imbalances that affect its ability to quickly respond to the control signals connected thereto.

Other prior art solutions involve performing individual multiplexer operations on each data signal before it is connected to the sense amplifier. In other words, a multiplexer circuit is connected between each data signal and the sense amplifier. In response to pre-determined logic conditions, each multiplexer either outputs a logic high level, a logic low level, or the logic level of the attached input data signal. The output of the multiplexer is conveyed to the sense amplifier such that the sense amplifier output terminals are set to a logic high level, reset to a logic low level or are responsive to the input data signals. However, such a configuration adds additional propagation delay from the time when data is asserted on the data signals until the resulting output data is generated by the sense amplifier, thereby reducing performance.

SUMMARY OF THE INVENTION

Accordingly, a method and apparatus for adding set and reset functions to a sense amplifier is desired such that those functions can be performed by the sense amplifier rather than by circuits connected to the sense amplifier. The present invention allows set and reset functionality to be added to the sense amplifier in a manner that minimally impacts the performance of that sense amplifier.

In accordance with a first aspect of the present invention, a set and reset circuit is incorporated into a sense amplifier for setting or resetting the sense amplifier output terminals in response to assertions of set and reset control signals. When the set control signal is asserted, a first discharge path allows a charge stored on one of the output terminals to be discharged at a rate that is proportional to a voltage level developed on the set control signal. Alternatively, when the reset control signal is asserted, a second discharge path allows a charge stored on a second output terminal to be discharged at a rate that is proportional to a voltage level developed on the reset control signal.

When the set and reset control signals are de-asserted, the sense amplifier operates in a normal manner. Accordingly, the first discharge path discharges charge stored on one of the output terminals at a rate that is proportional to a voltage level developed on a first data signal. Also, the second discharge path discharges charge stored on the opposing one of the output terminals at a rate that is proportional to a voltage level developed on a second data signal that represents a logic level that is complementary to the logic level represented by the first data signal.

The set and reset circuit includes a high conductance characteristic such that the discharge paths can discharge the corresponding charges from the output terminals at a faster rate in proportion to the set or reset control signals, than in proportion to the data signals.

In a further embodiment of the invention, the sense amplifier includes an evaluate unit. The evaluate unit is connected to an electrical ground for conveying the charges developed on the first and second output terminals thereto through the respective discharge paths.

In a still further embodiment of the invention, the set and reset circuit includes a pair of conductive paths that are turned-on in response to an assertion of the set or reset control signals, respectively. Those conductive paths are connected in parallel with associated portions of the discharge paths such that effects imposed on those discharge paths due to the data signals can be overridden.

Accordingly, the present invention allows the output terminals of the sense amplifier to be set or reset without significantly affecting that sense amplifier's performance.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIGS. 10a and 10b are timing diagrams of the operation of the sense amplifier of FIG. 4;

DETAILED DESCRIPTION OF THE INVENTION

Generally, the sense amplifier of the present invention provides additional functionality to a sense amplifier circuit by allowing that circuit's latched output signals to be set or reset in response to a pair of control signals. That functionality is added to the sense amplifier in such a manner that the performance is essentially maintained. Further, the sense amplifier maintains its ability to operate in response to low swing or full swing data input signals.

I. A Computer System

Figure 1:
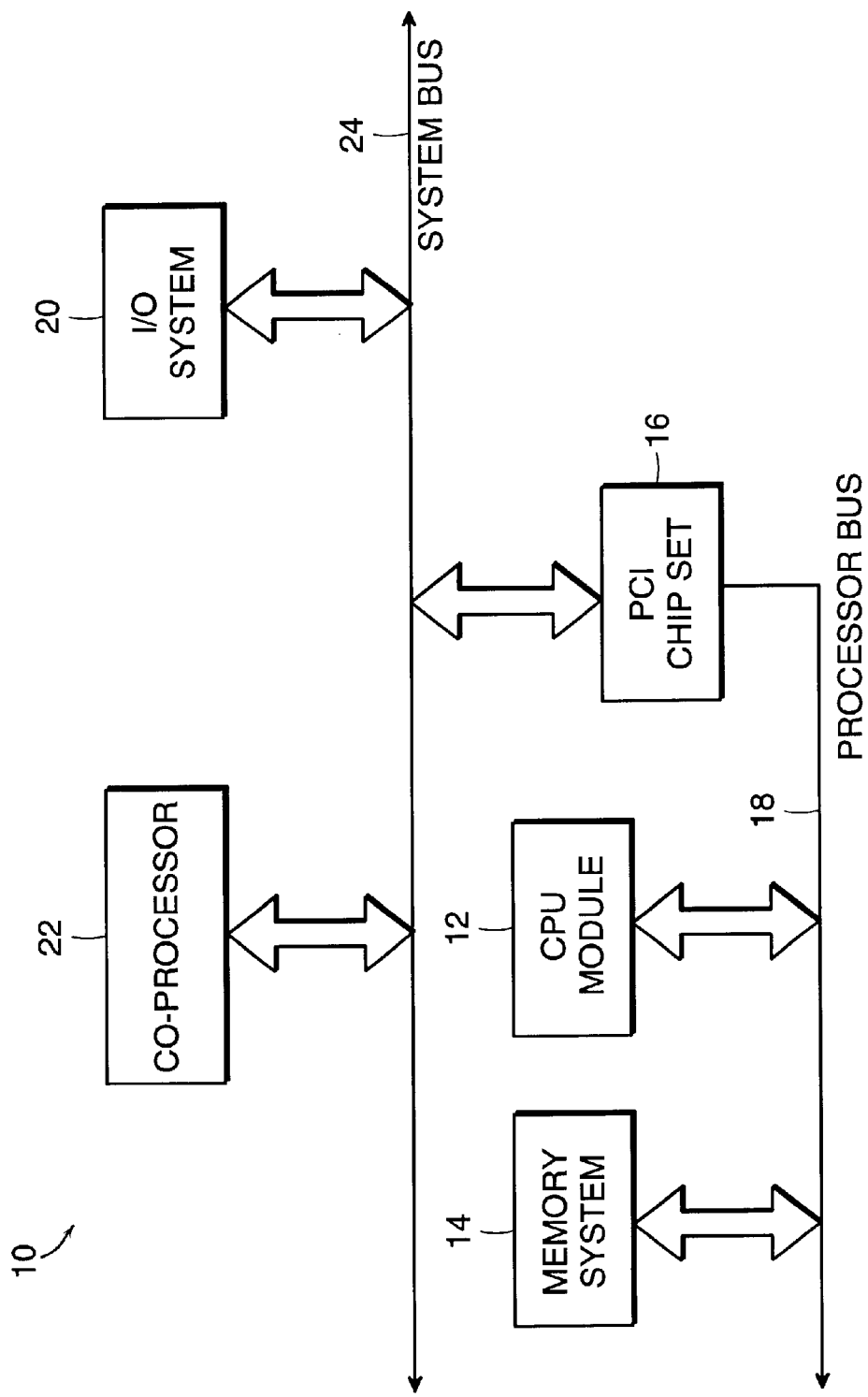
FIG. 1 is a schematic drawing of a computer system including a central processing module in which the present invention can be used.

FIG. 1 is a schematic diagram of a computer system 10 that includes a central processing unit (CPU) module 12, a memory system 14 and a PCI chip set 16 connected by a processor bus 18. The PCI chip set 16 is further connected to an I/O system 20 and a co-processor module 22 by a system bus 24. Central processing module 12 can include a number of sense amplifiers according to the present invention.

Figure 2:
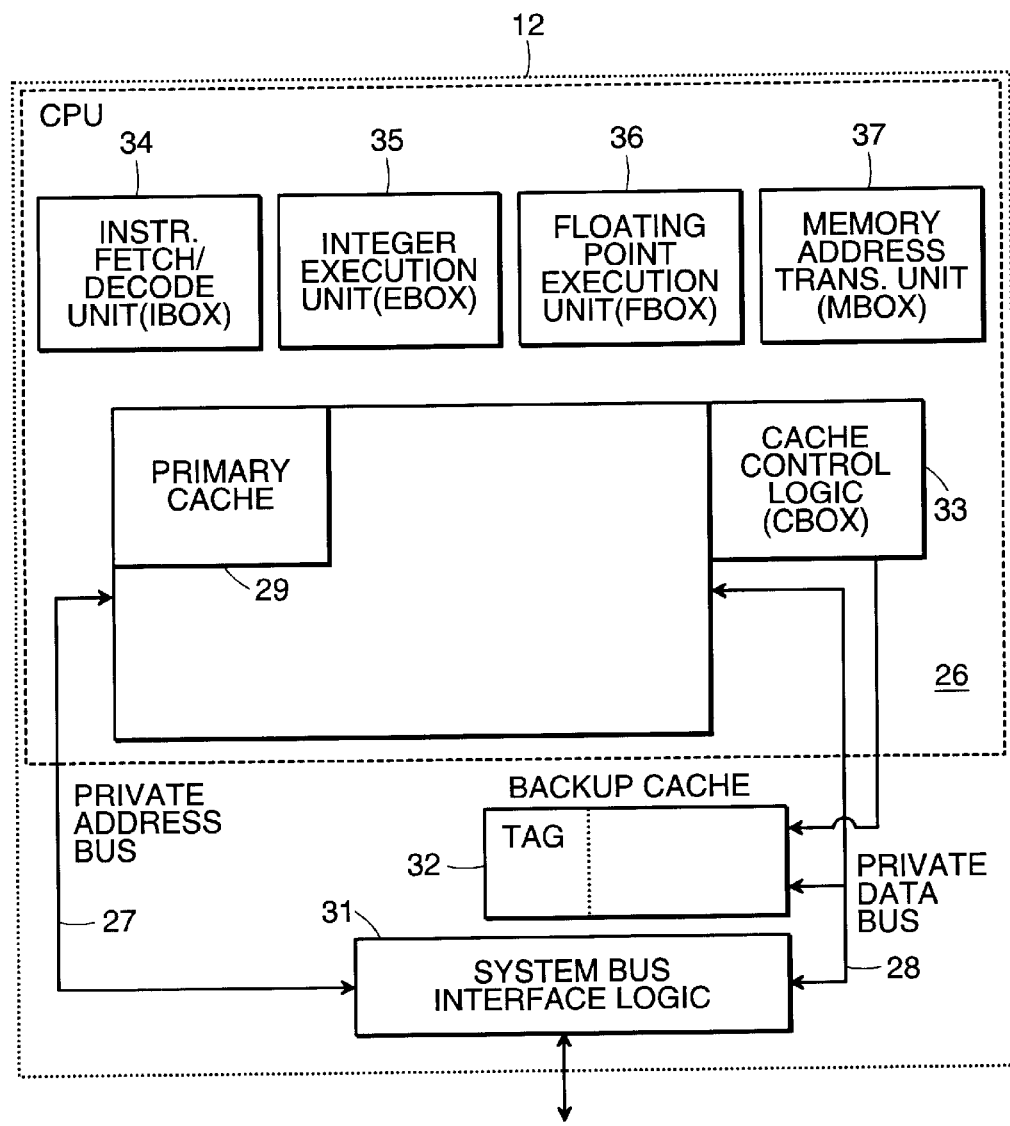
FIG. 2 is a schematic diagram of the central processing module of FIG. 1.

Referring now to FIG. 2, central processing module 12 is shown to include a CPU 26. A private address bus 27 and a private data bus 28 within CPU 26 connects a primary cache 29 and a system bus interface 31. The private data bus 28 connects the CPU 26 to a backup cache (Bcache) 32 that, along with the primary cache 29, is controlled by the Cache Control and Bus Interface unit 33.

CPU 26 further includes several logic circuits that enable it to perform the major operations that the computer system 10 requires. The Ibox 34, or Instruction Fetch and Decode Unit, controls instruction prefetching, instruction decoding, branch prediction, instruction issuance, and interrupt handling. The Ebox 35, or Integer Execution Unit, handles the functions of addition, shifting, byte manipulation, logic operations, and multiplication for integer values stored in the system. Similar operations, for floating point values, are controlled by the Fbox 36, or Floating Point Execution Unit. The Mbox 37, or Memory Address Translation Unit, translates virtual addresses, generated by programs running on the system, into physical addresses which are used to access locations in the computer system. Lastly, the Cbox 33, or Cache Control and Bus Interface Unit, controls the primary cache 29 and backup cache 32. It also controls the private data bus 28, private address bus 27, memory related external interface functions, and all accesses initiated by the Mbox 37.

Each of the circuits mentioned above include sense amplifiers to detect and latch logic levels of transferred data signals. Accordingly, sense amplifiers or edge-triggered latches are widely used in many different areas of CPU module 12. In order to increase the rate at which data signals can be presented to those sense amplifiers, their functionality and performance must be increased.

II. An Inventive Sense Amplifier

Figure 3:
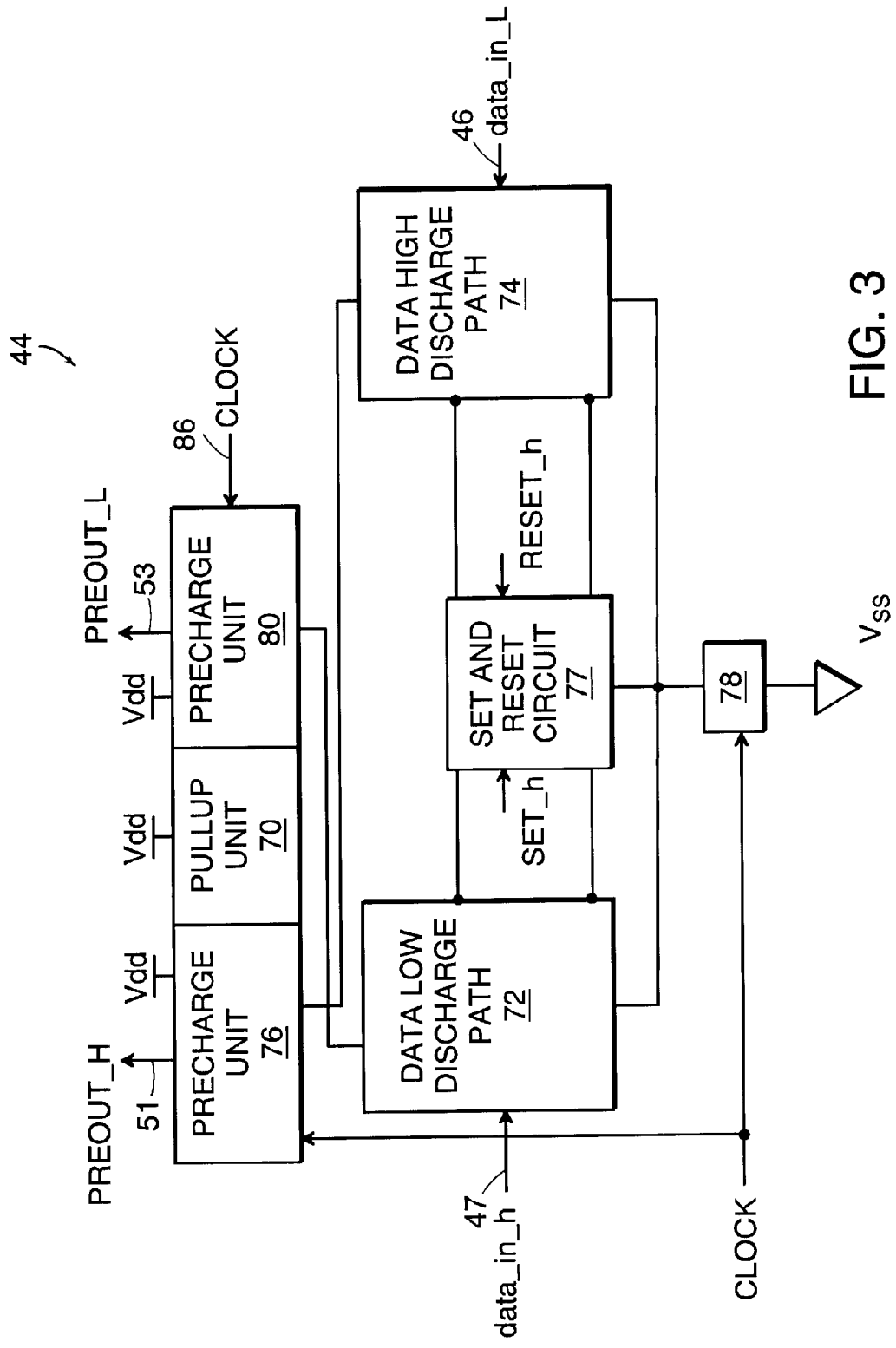
FIG. 3 is a functional block diagram of a sense amplifier that can be practiced in the central processing module of FIG. 2, according to the present invention.

Referring now to FIG. 3, a functional block diagram of sense amplifier 44 is shown to include set and reset circuit 77 that allows output signal PREOUT_H 51 to be set in response to signal SET_H being asserted. Also, set and reset circuit 77 allows output signal PREOUT_H 51 to be reset in response to signal RESET_H being asserted. Signal PREOUT_L 53 responsively develops a complementary logic level to the logic level developed on signal PREOUT_H 51. Signals PREOUT_H 51 and PREOUT_L 53 attain the set or reset logic levels when an evaluate unit 78 is turned-on, allowing the sense amplifier 44 to evaluate the data and control signals input thereto. When signals SET_H and RESET_H are both de-asserted, sense amplifier 44 essentially performs as if set and reset circuit 77 was not connected. Accordingly, the addition of set and reset circuit 77 does not significantly impact the performance of the sense amplifier's sensing and latching functionality.

Sense amplifier 44 further includes pre-charge units 76 and 80 that are used for initializing or "pre-charging" the internal nodes of sense amplifier 44 to predetermined logic levels. Sense amplifier 44 also includes a pair of discharge paths, the data low discharge path 72 and the data high discharge path 74, connected between the evaluate unit 78 and a pull-up unit 70.

The pre-charge units are connected to a clock signal 86 and pre-charge the internal nodes when that clock signal 86 transitions to a logic low level. Alternatively, when the clock signal 86 transitions to a logic high level, the pre-charge units are turned-off and evaluate unit 78 is turned-on. Evaluate unit 78 allows current to flow from the data high/low discharge path 72 and from the data low/high discharge path 74 to Vss or ground.

When one of the control signals SET_H or RESET_H are asserted, the associated discharge path 72 or 74 will allow current to flow to Vss through a portion of set and reset circuit 77 and evaluate unit 78. Responsively, one of the output signals PREOUT_H 51 or PREOUT_L 53 will discharge to a logic low level, i.e. a reset level, and the complementary output signal will remain at a logic high level, i.e. a set level. The set and reset functionality operates independently of the voltages that develop on data signals data_in_h 47 and data_in_1 46.

It should be noted that signals data_in_h 47 and data_in_1 46 can be either low voltage swing signals that are pre-charged or full voltage swing signals. Although the present embodiment of the invention applies to either type of signal, it is particularly beneficial where those data signals are low voltage swing signals. That is because it is difficult to include logic functions, such as set and reset functions, in a sense amplifier's input stacks due to differential sensitivity limits and signal noise issues.

When signals SET_H and RESET_H are both de-asserted, sense amplifier 44 latches logic levels on output signals PREOUT_H 51 and PREOUT_L 53 that correspond to the voltage levels that have developed on data signals data_in_h 47 and data_in_1 46. That latch operation is achieved because one of the discharge paths 72 or 74 allows current to flow at a faster rate in response to the voltage levels developed on signals data_in_1 46 and data_in_h 47. Responsively, one of the associated output signals, PREOUT_H 51 or PREOUT_L 53 will be discharged at a faster rate. The output signal 51 or 53 that discharges at the faster rate will be detected and allowed to continue to discharge. The remaining output signal 51 or 53 will be pulled to Vdd by the pull-up unit 70. Accordingly, a rail-to-rail or full swing voltage signal having the same polarity as data_in_1 46 will be latched on the PREOUT_L signal 53. Also, the complementary rail-to-rail voltage will be latched on output signal PREOUT_H 51.

Figure 4:
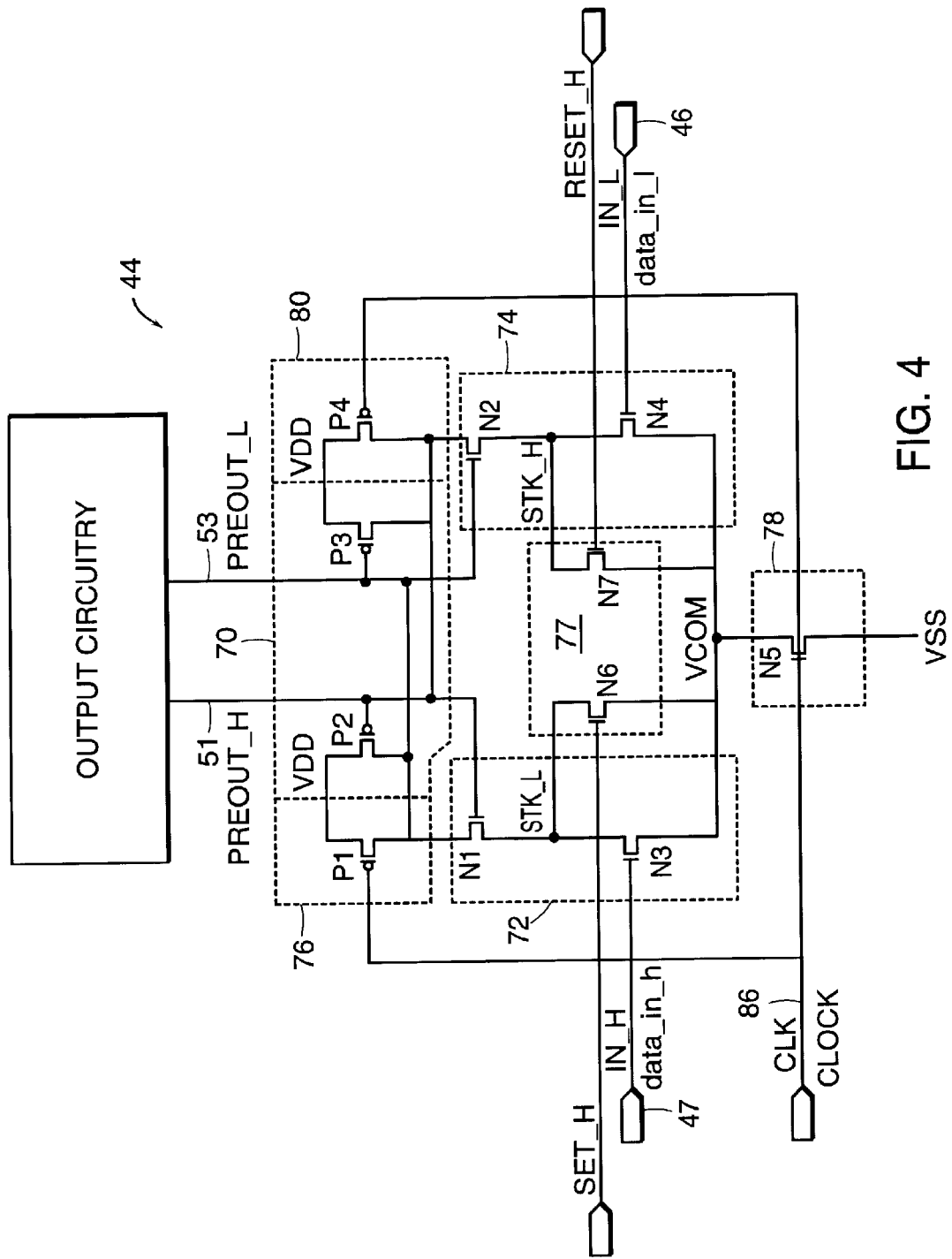
FIG. 4 is a schematic diagram of an embodiment of the sense amplifier of FIG. 3, according to the present invention.

Referring now to FIG. 4, a schematic diagram of an embodiment of a sense amplifier, according to the present invention, is shown. Control signals SET_H and RESET_H are connected to NMOS transistors N6 and N7, respectively. Also, data signals data_in_1 46 and data_in_h 47 are connected to NMOS transistors N4 and N3, respectively. Transistors N6 and N7 have significantly more conductance capability than transistors N4 and N3. Therefore, when signal SET_H is asserted at the same time as data signal data_in_1, or signal RESET_H is asserted at the same time as data signal data_in_h, the set and reset function will override the effects of those data signals. Accordingly, the output signals will be set or reset in response to control signals SET_H and RESET_H independent of the data signals.

IV. Pre-charge Operation

Figure 5:
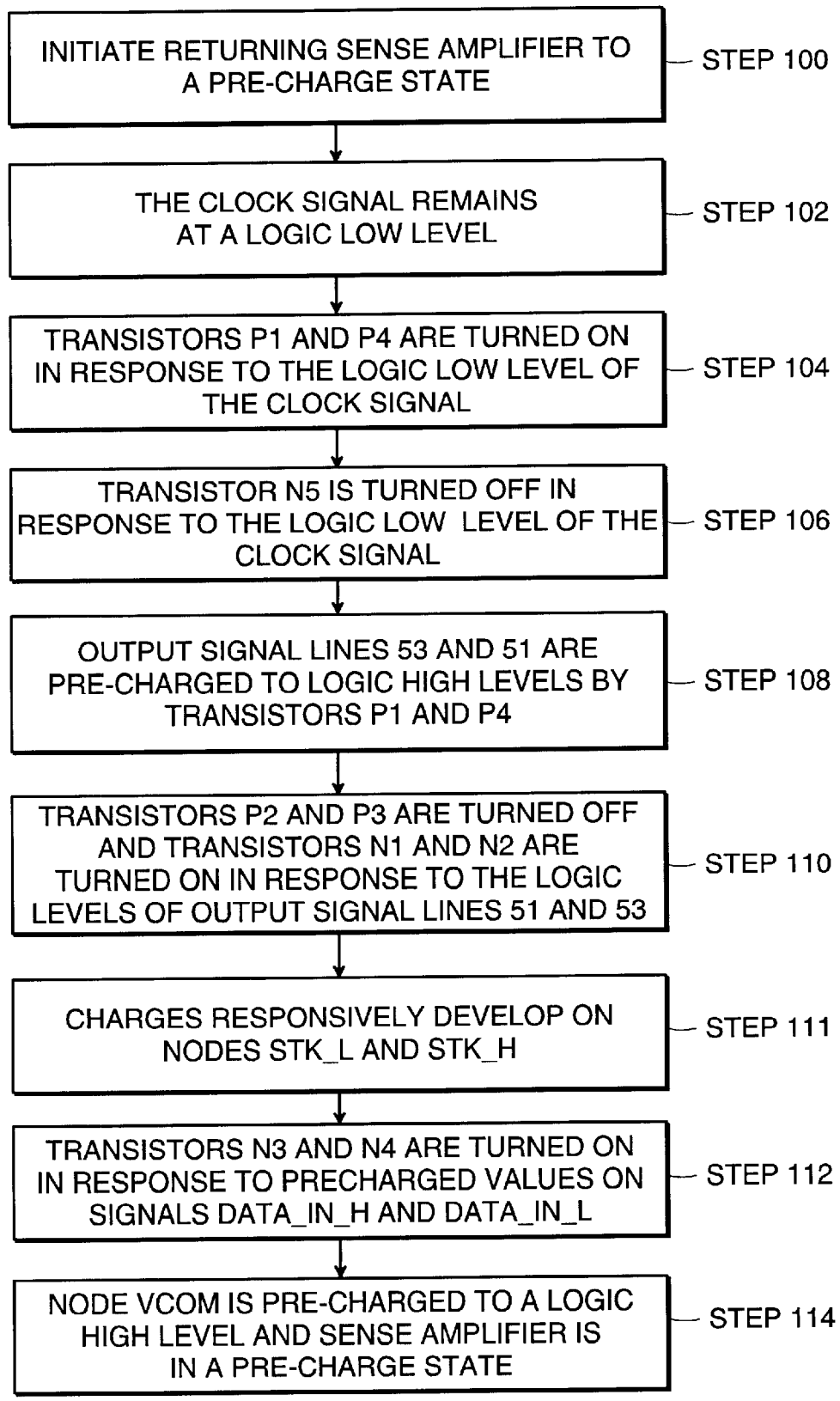
FIG. 5 is a flow diagram of the pre-charge operation of the sense amplifier of FIG. 4.

Referring now to the flow diagram of FIG. 5 and to the schematic diagram of FIG. 4, the pre-charge operation of sense amplifier 44 will be described. Sense amplifier 44 initiates a return to a reset or "pre-charge" state between each sensing or latching operation (Step 100). In such a pre-charge state, the input clock signal 86 remains at a logic low level (Step 102). The clock signal 86 conveys that logic low level to the gate of PMOS transistors P1 and P4, turning them "on" or, in other words, allowing current to flow from their source terminals to their drain terminals (Step 104). The logic low level is also conveyed to the gate terminal of NMOS transistor N5, turning it "off" (Step 106). It should be noted that NMOS transistor N5 is referred to as the "evaluate" transistor and is only turned-on during the sensing operation.

When transistors P1 and P4 are turned-on, signal lines PREOUT_L 53 and PREOUT_H 51 are charged to approximately the same voltage as Vdd. Output signal lines 51 and 53 are thereby pre-charged to logic high levels (Step 108). The logic levels of signals PREOUT_H 51 and PREOUT_L 53 are conveyed to the gate terminals of PMOS transistors P2 and P3, which are turned-off, and to the gate terminals of NMOS transistors N1 and N2, which are turned-on (Step 110). When transistors N1 and N2 are turned-on, charge is developed on nodes STK_L and STK_H (Step 111).

Further, because signal lines data_in_h 47 and data_in_1 46 are typically precharged by the circuits that generate them, a logic high level is conveyed to the gates of NMOS transistors N3 and N4, which are responsively turned-on (Step 112). Accordingly, node VCOM is pre-charged to a logic high level and sense amplifier 44 is referred to as being in a pre-charge state (Step 114).

V. Set and Reset Circuit Operation

Figure 6:
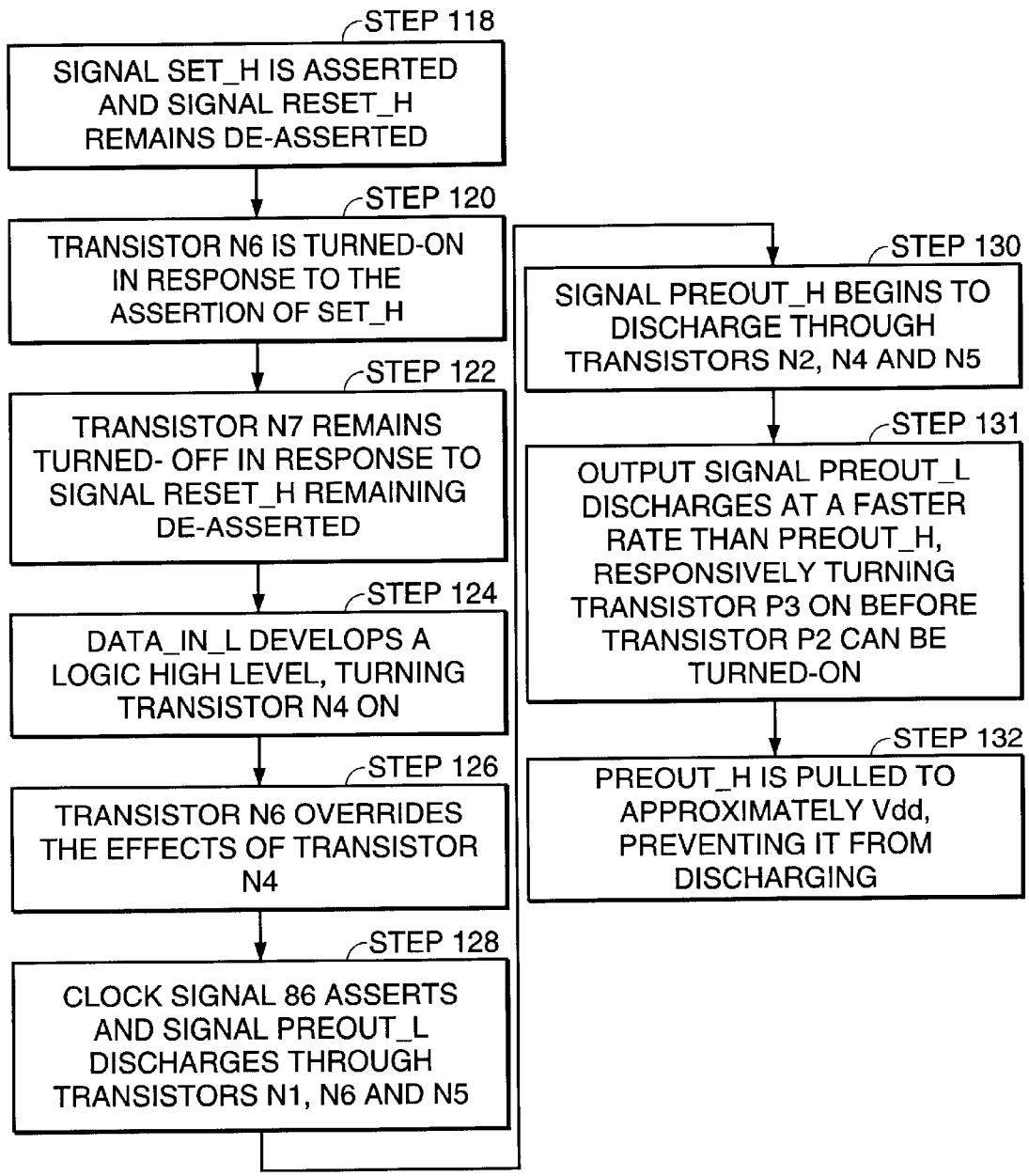
FIG. 6 is a flow diagram of the operation of the sense amplifier of FIG. 4.
Figure 10B:
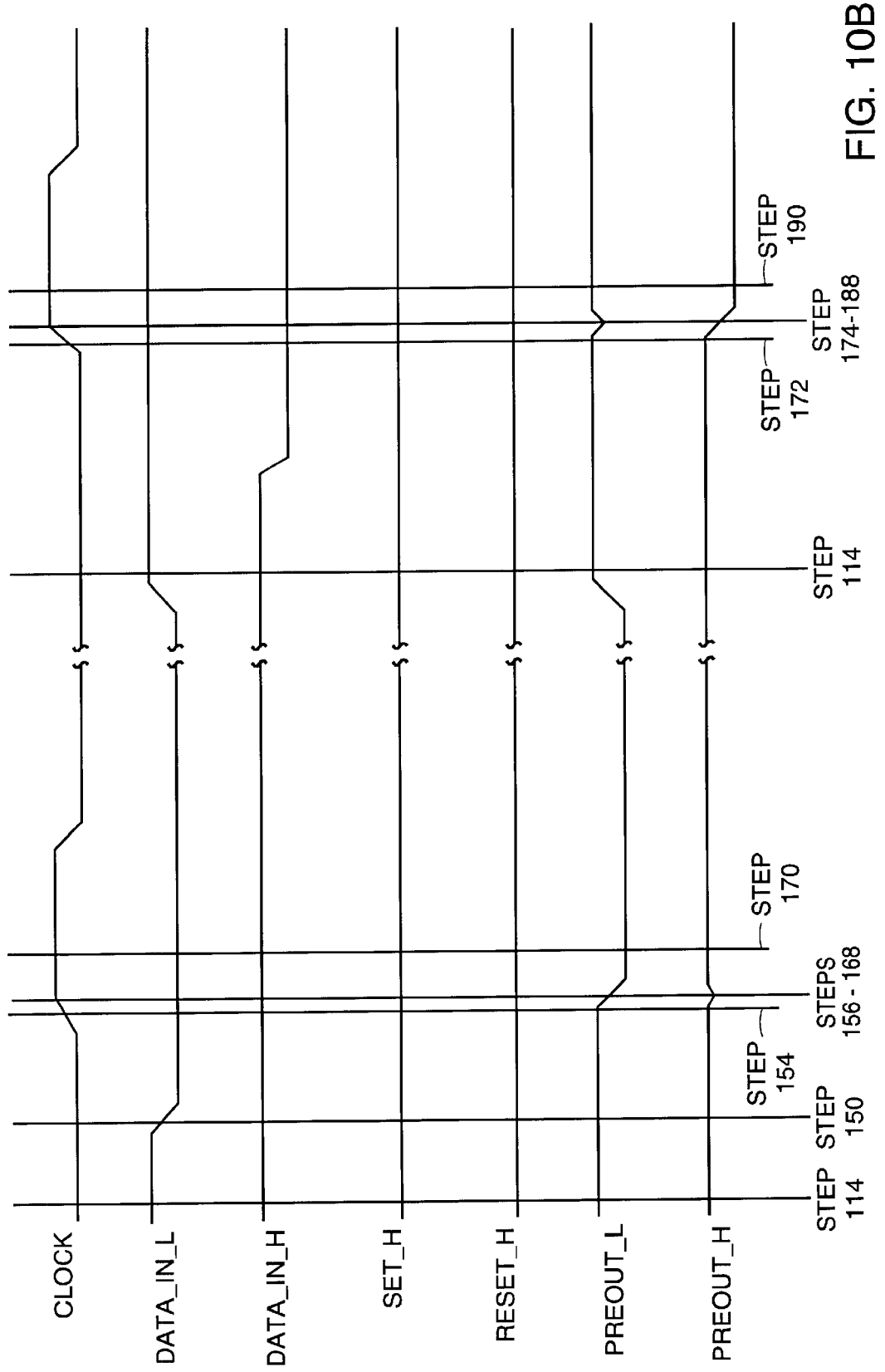

Referring now to the flow diagram of FIG. 6 and the timing diagram of FIG. 10A, the operation of sense amplifier 44 will be shown in response to control signal SET_H being asserted, and signal RESET_H remaining de-asserted, before a sense operation is initiated (Step 118). When control signal SET_H is asserted, the associated logic high level is conveyed to the gate terminal of NMOS transistor N6, turning it on (Step 120). The logic low level developed on control signal RESET_H is conveyed to the gate terminal of NMOS transistor N7, such that it remains turned-off (Step 122). For illustration purposes consider that signal data_in_1 46 is a low voltage swing signal and remains at a pre-charge voltage that is representative of a logic high level. That logic high level turns transistor N4 on (Step 124). Because transistor N6 is significantly larger than transistor N4, in the sense that transistor N6 has a much larger width to length ratio than transistor N4, the amount of current that can responsively flow through transistors N1 and N6 when evaluate transistor N5 is turned-on will override the smaller amount of current that can flow through data high discharge path 74 (Step 126).

Accordingly, when clock signal 86 asserts and turns transistor N5 on, output signal PREOUT_L 53 discharges to a voltage that represents a logic low level through transistors N1, N6 and N5 (Step 128). At the same time, output signal PREOUT_H 51 begins to discharge through transistors N2, N4 and N5 (Step 130). Because transistor N6 allows signal PREOUT_L to discharge at a faster rate than signal PREOUT_H, transistor P3 will turn-on before transistor P2 (Step 131). Accordingly, signal PREOUT_H is pulled to a voltage that is approximately equal to Vdd, preventing it from discharging to a logic low level (Step 132).

Figure 7:
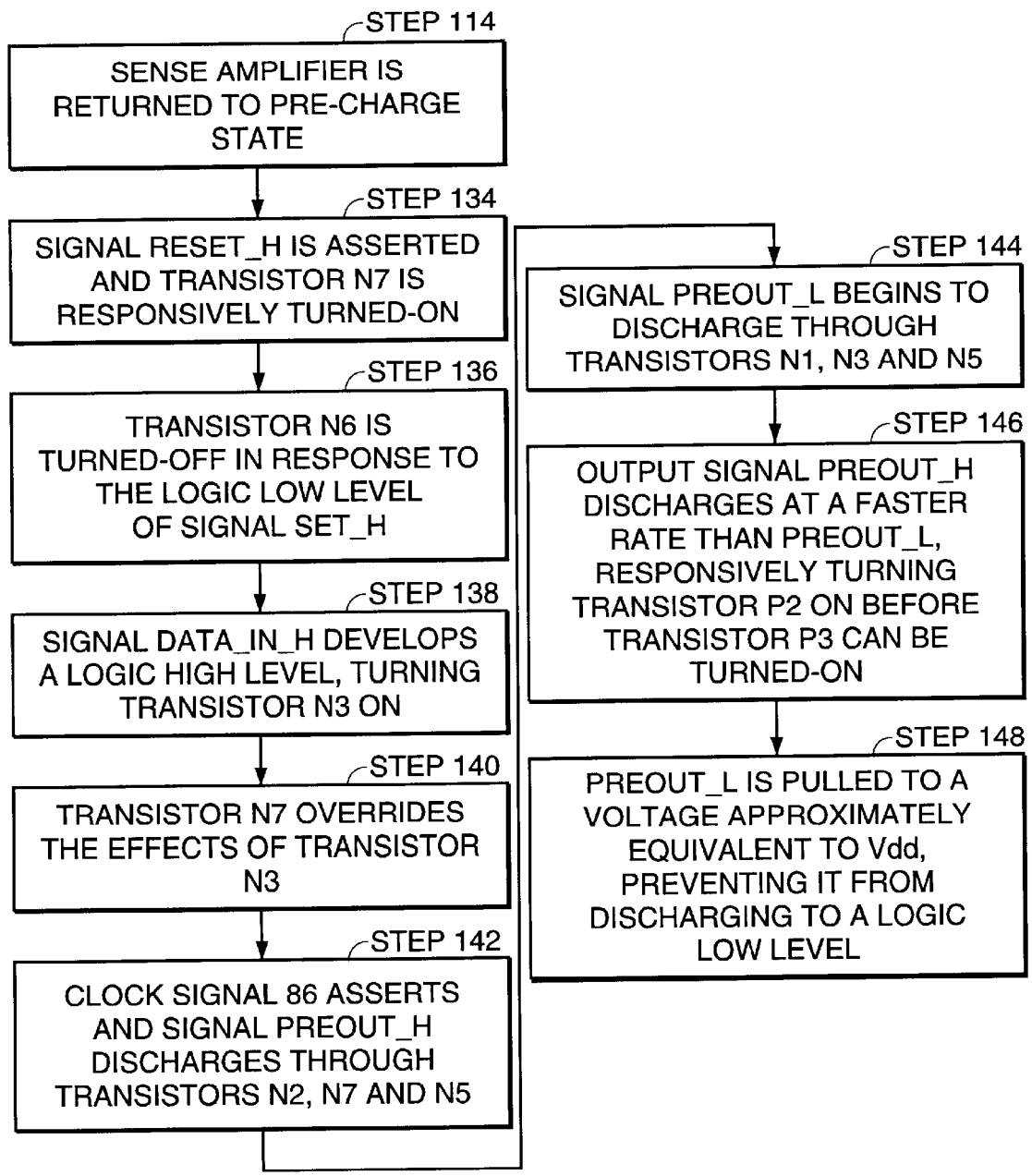
FIG. 7 is a flow diagram of a further operation of the sense amplifier of FIG. 4.

Alternatively, referring now to the flow diagram of FIG. 7, the operation of sense amplifier 44 will be shown in response to control signal SET_H being de-asserted and signal RESET_H being asserted. Consider that sense amplifier 44 is returned to a precharge state (Step 114). When control signal RESET_H is asserted, the voltage associated with that logic high level is conveyed to the gate terminal of NMOS transistor N7, turning it on (Step 134). The logic low level developed on control signal SET_H is conveyed to the gate terminal of NMOS transistor N6, turning it off (Step 136). For illustration purposes consider that signal data_in_h develops a voltage that is representative of a logic high level, turning transistor N3 on before clock signal 86 is asserted (Step 138). Because transistor N7 is significantly larger than transistor N3, the amount of current that can responsively flow through transistors N7 and N5 when evaluate transistor N5 is turned-on will override the smaller amount of current that can flow through data high discharge path 72 (Step 140).

Accordingly, when clock signal 86 asserts and turns transistor N5 on, output signal PREOUT_H 51 will discharge to a voltage that represents a logic low, or reset, level through transistors, N2, N7 and N5 (Step 142). At the same time, output signal PREOUT_L 53 begins to discharge through transistors N1, N3 and N5 (Step 144). Because transistor N7 allows signal PREOUT_H to discharge at a faster rate than signal preout_1, transistor P2 will turn-on before transistor P3 can be turned-on (Step 146). Accordingly, signal preout_1 is pulled to a voltage that is approximately equal to Vdd, preventing it from discharging to a logic low level (Step 148).

Figure 8:
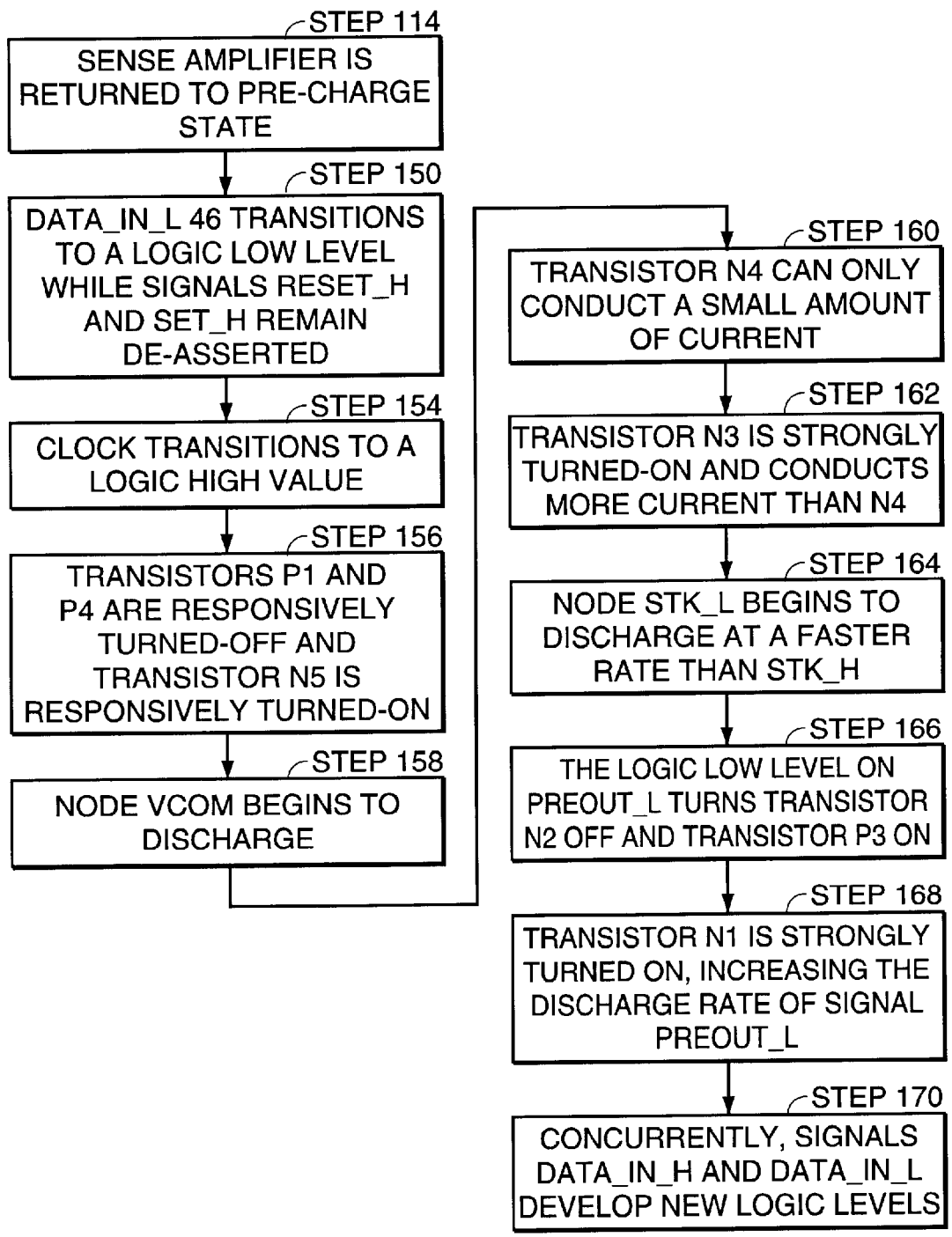
FIG. 8 is a flow diagram of the operation of the sense amplifier of FIG. 4 in response to de-assertion of control signals SET_H and RESET_H.

VI. Sense Amplifier Operation: Data_in_1 Transition when Control Signals SET_H and RESET_H are De-asserted Referring now to the flow diagram of FIG. 8 and the timing diagram of FIG. 10B, the operation of sense amplifier 44 will be shown in response to data_in_1 46 transitioning from a logic high level to a logic low level when control signals SET_H and RESET_H are de-asserted. When control signals SET_H and RESET_H are de asserted, sense amplifier operates as if set and reset circuit 77 were not connected to the circuit. In other words, normal sense amplifier functionality is retained.

Consider that data_in_1 46 and data_in_h 47 are low voltage swing signals that have been pre-charged to voltages that represent logic high levels and sense amplifier 44 is in a pre-charged state (Step 114). At a given point in time, data line 46 will transition to a voltage that represents a logic low level while signals SET_H and RESET_H remain de-asserted (Step 150). After data line 46 reaches that voltage, clock signal 86 will transition to a logic high level (Step 154). That logic high level is conveyed to PMOS transistors P1 and P4, turning them off. The clock signal 86 is also conveyed to NMOS evaluate transistor N5, simultaneously turning it on (Step 156). Because NMOS transistor N5 has its source terminal connected to Vss (ground), node VCOM begins to discharge to a logic low level (Step 158).

At this point in the cycle, the source terminals of NMOS transistors N3 and N4 have a path to Vss, through transistor N5. Because signal data_in_1 46 has transitioned to a logic low level, transistor N4 will be only "weakly" turned-on, i.e. it can only conduct a small amount of current (Step 160). However, because data_in_h 47 has transitioned to a logic high level, NMOS transistor N3 will be turned-on and conducts more current than transistor N4 (Step 162). Accordingly, node STK_L begins to discharge through transistors N3 and N5 at a faster rate than node STK_H is discharged through N4 and N5. In response, signal PREOUT_L 53 begins to discharge through transistor N1 at essentially the same rate as node STK_L (Step 164).

When signal PREOUT_L 53 reaches a logic low level, it is conveyed to the gate terminal of transistor N2, which is responsively turned-off, and the gate terminal of transistor P3, which is responsively turned-on (Step 166). When transistor P3 is turned-on, it quickly raises PREOUT_H 51 and the gate terminal of transistor N1 to a logic high level, thereby strongly turning transistor N1 on and further increasing the rate that signal PREOUT_L 53 is discharged (Step 168). Thus, signal PREOUT_L 53 is latched at a logic low level and signal PREOUT_H 51 is latched at a logic high level.

Once signals PREOUT_H 51 and PREOUT_L 53 reach their final voltage levels, subsequent changes to the input data signals will not affect them (Step 170). Only when clock signal 86 falls to a logic low level does the latch reset, or pre-charge, in preparation for the next input data transition.

VII. Sense Amplifier Operation: Data_in_h Transition when Control Signals SET_H and RESET_H are De-asserted.

Figure 9:
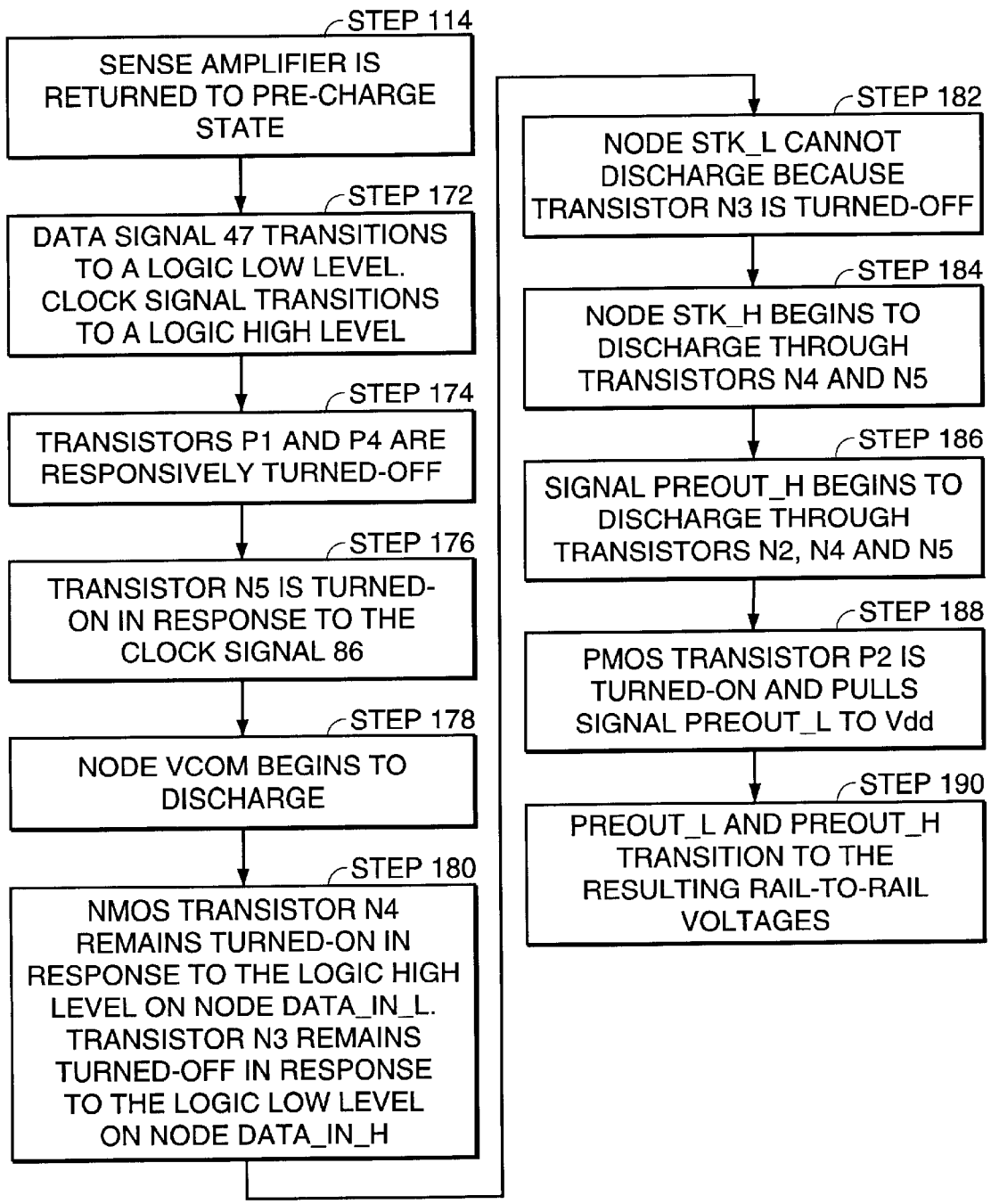
FIG. 9 is a flow diagram of a further operation of the sense amplifier of FIG. 4 in response to de-assertion of control signals SET_H and RESET_H.

Referring now to the flow diagram of FIG. 9, the operation of sense amplifier 44 will be described in response to signal data_in_h 47 transitioning from a logic high level to a logic low level. For illustration purposes, consider that the sense amplifier 44 has been returned to the reset or pre-charge state in the manner previously described (see FIG. 5) (Step 114). When sense amplifier 44 is in such a pre-charge state, the input clock signal 86 is at a logic low level.

When signal data_in_h 47 reaches a logic low level that can be evaluated by sense amplifier 44, the clock signal 86 transitions from a logic low level to a logic high level (Step 172). The clock signal 86 is conveyed to the gate of PMOS transistors P1 and P4, turning them off (Step 174). Also, NMOS evaluate transistor N5 is turned-on, or fired in response to the logic level of the clock signal 86 (Step 176). Because NMOS transistor N5 has its source terminal connected to Vss, node VCOM begins to discharge to a logic low level (Step 178).

At this point in the cycle, NMOS transistor N4 is turned-on, and transistor N3 is turned-off in response to signals data_in_1 46 and data_in_h 47 (Step 180). Therefore, node STK_L cannot discharge through transistor N3 (Step 182) and node STK_H begins discharging through transistors N4 and N5 to Vss (Step 184). Also, signal PREOUT_H 51 begins to discharge through transistors N2, N4 and N5 (Step 186). When signal PREOUT_H 51 achieves a sufficiently low voltage, PMOS transistor P2 is turned-on and begins to pull signal PREOUT_L up to Vdd (Step 188). Subsequently, signals PREOUT_L and PREOUT_H continue to transition until they reach their resulting rail-to-rail voltages (Step 190). Accordingly, the logic levels of signals data_in_1 46 and data_in_h 47 are mirrored by rail-to-rail voltage levels on signals PREOUT_L 53 and PREOUT_H 51, respectively.

It will be recognized by one of ordinary skill in the art that the functionality of the inventive sense amplifier will be preserved if the NMOS and PMOS transistors are exchanged, along with the polarity of the associated logic signals. Further, the instant sense amplifier can be used in any circuit or application that utilizes a sense amplifier. For example, such circuits include edge-triggered latches and flip flops. Also, the sense amplifier of the present invention is not limited to low swing data signals and also works with complementary full swing data signals.

It should be noted that set and reset circuit 77, depicted in FIG. 4, can also be implemented without NMOS transistor N7. In such an implementation, output signal PREOUT_H can be set in response to an assertion of signal SET_H. However, a similar reset function would not be possible. Likewise, set and reset circuit 77 can be implemented without NMOS transistor N6. In such an implementation, output signal PREOUT_H can be reset in response to an assertion of signal RESET_H. However, a similar set function would not be possible.

VIII. Alternative Embodiments of the Present Invention

Figure 11:
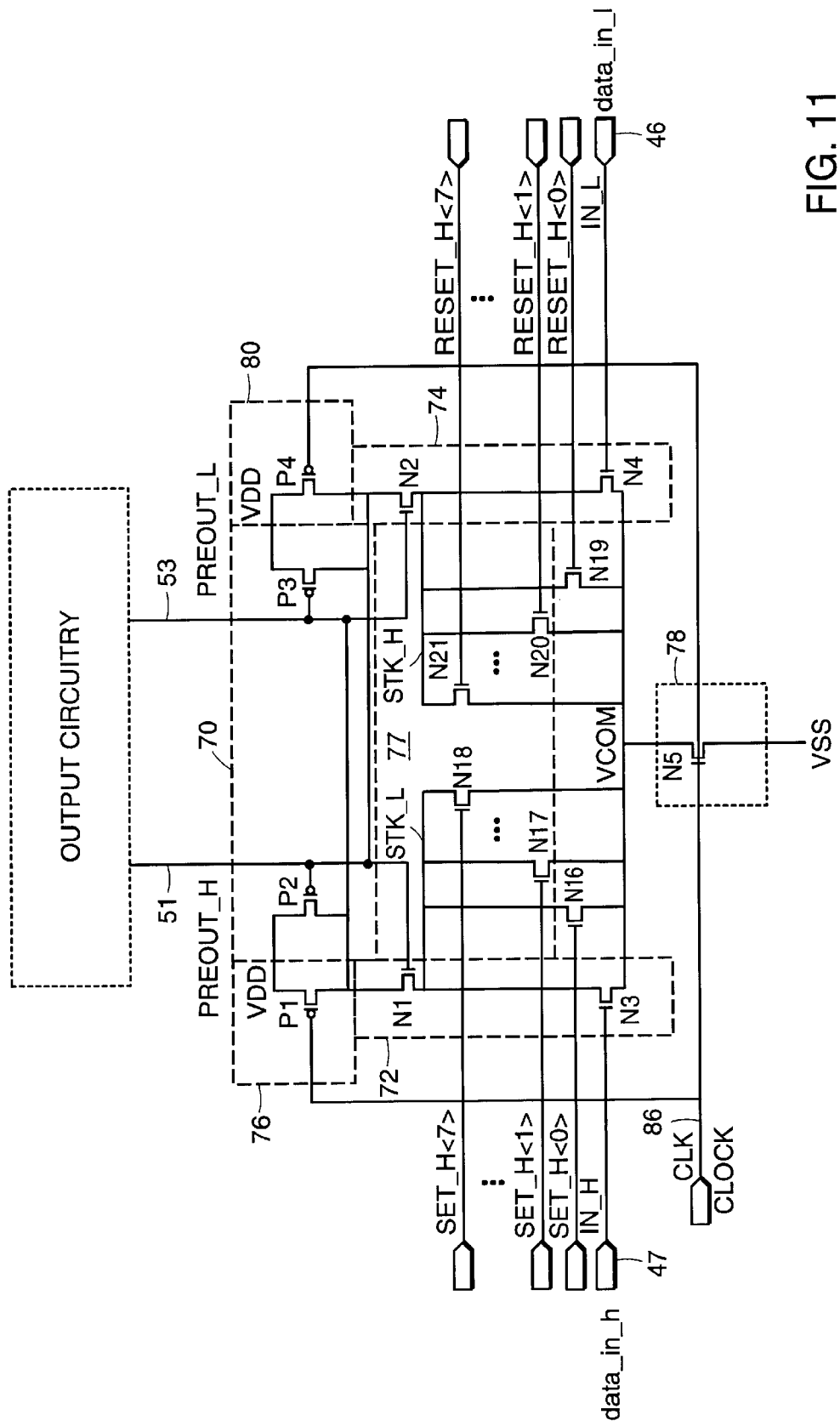
FIG. 11 is a schematic diagram of a further embodiment of the sense amplifier of FIG. 4, according to the present invention.

Referring now to FIG. 11, an alternative embodiment of sense amplifier 44 is shown to further include a number of control signals referred to as SET_H<0:n> and RESET_H<0:n>. Each of the SET_H<0:n> signals are connected to the gate terminal of an NMOS transistor, e.g. N16–N18. Each of those NMOS transistors N16–N18 are connected in parallel with transistor N3 that receives data signal data_in_h 47. Transistors N16–N18 are larger than transistors N3 and N4 such that if any of the SET_H<0:n> signals are asserted, they will draw more current than N3 or N4 and therefore override any effect that they would otherwise have had.

Likewise, each of the RESET_H<0:n> signals are connected to the gate terminal of an NMOS transistor, e.g. N9–N11. Each of those NMOS transistors N9–N11 are connected in parallel with transistor N4 that receives data signal data_in_1 46. Transistors N9–N11 are also larger than transistors N3 and N4 such that if any of the RESET H<0:n> signals are asserted, they will draw more current than N3 or N4 and therefore override any effect that they would otherwise have had.

Accordingly, a number of different logic functions can set or reset sense amplifier 44 by asserting one of the SET_H<0:n> or RESET_H<0:n> signals. Also, with such a configuration the set and reset signals can be asserted in a non-exclusive assertion mode. In such a mode, the sense amplifier is set or reset depending upon the number of SET_H<0:n> or reset<0:n> signals that are opposingly asserted. With such a configuration, the circuits that assert the set and reset signals must be maintained such that equal numbers of transistors are not turned on in both stacks, otherwise indeterminate operation may result.

Figure 12:
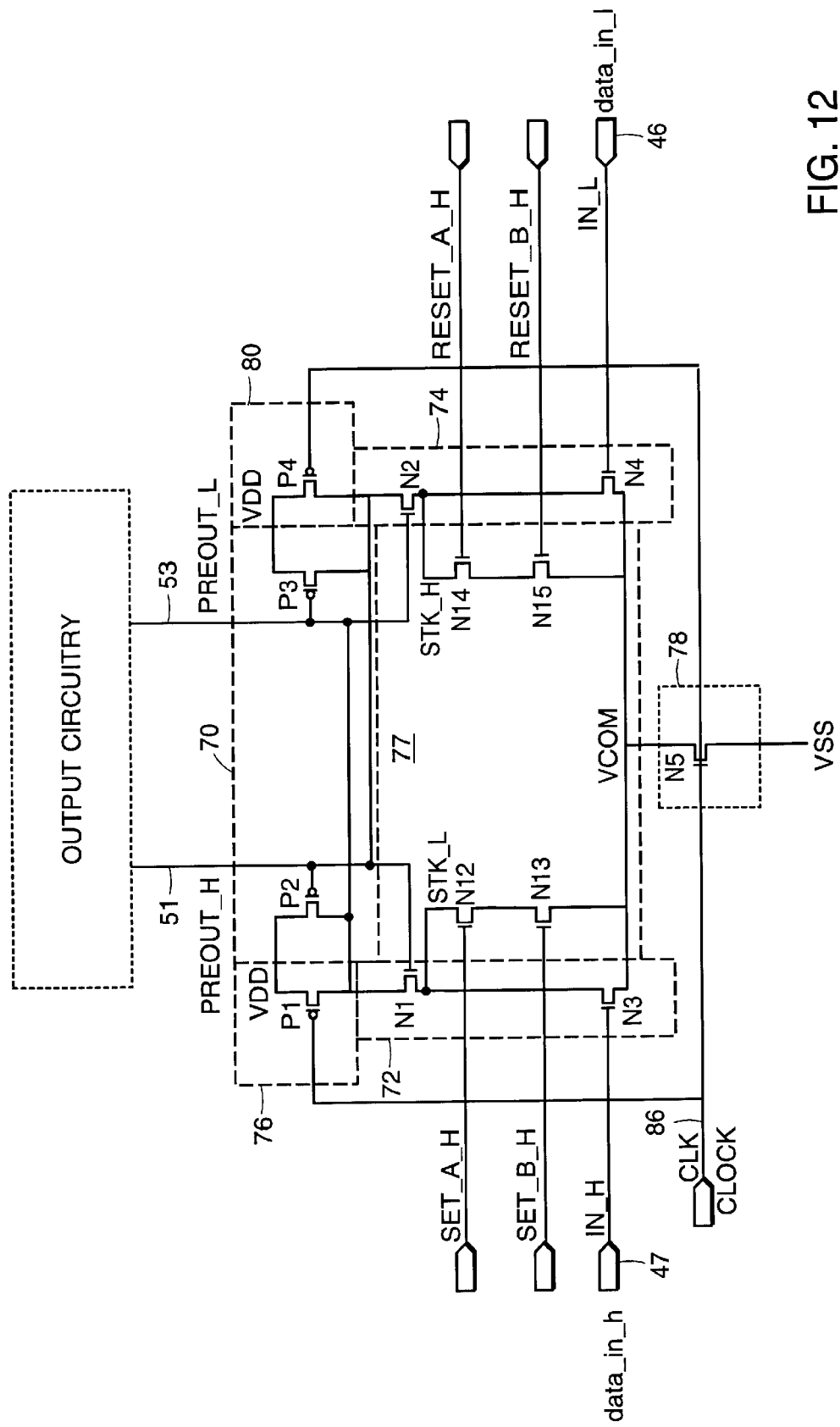
FIG. 12 is a schematic diagram of a still further embodiment of the sense amplifier of FIG. 4, according to the present invention.

Referring now to FIG. 12, sense amplifier 44 is shown to include serial connections of set and reset control signals, referred to as set_a_h, set_b_h, reset_a_h and reset_b_h. Control signals set_a_h and set_b_h are connected to NMOS transistors N12 and N13, respectively. Transistors N12 and N13 are connected in series such that they must both be turned-on before output signal PREOUT_H is set. In such a manner, a series of logic functions can be logically Anded together. When each of the logic functions are asserted, transistors N12 and N13 are turned-on and output signal PREOUT_H is set.

Likewise, control signals reset_a_h and reset_b_h are connected to NMOS transistors N14 and N15, respectively. Transistors N14 and N15 are connected in series such that they must both be turned-on before output signal PREOUT_H is reset. In such a manner, a series of logic functions can be logically Anded together. When each of the logic functions are asserted, transistors N14 and N15 are turned-on and output signal PREOUT_H is reset. When at least one transistor in each path remains turned-off, sense amplifier 44 operates in a normal sense amplifier fashion. In other words, sense amplifier 44 senses the logic levels of signals data_in_h 47 and data_in_1 46 and latches a corresponding logic level on output terminals PREOUT_H and PREOUT_L.

Figure 13:
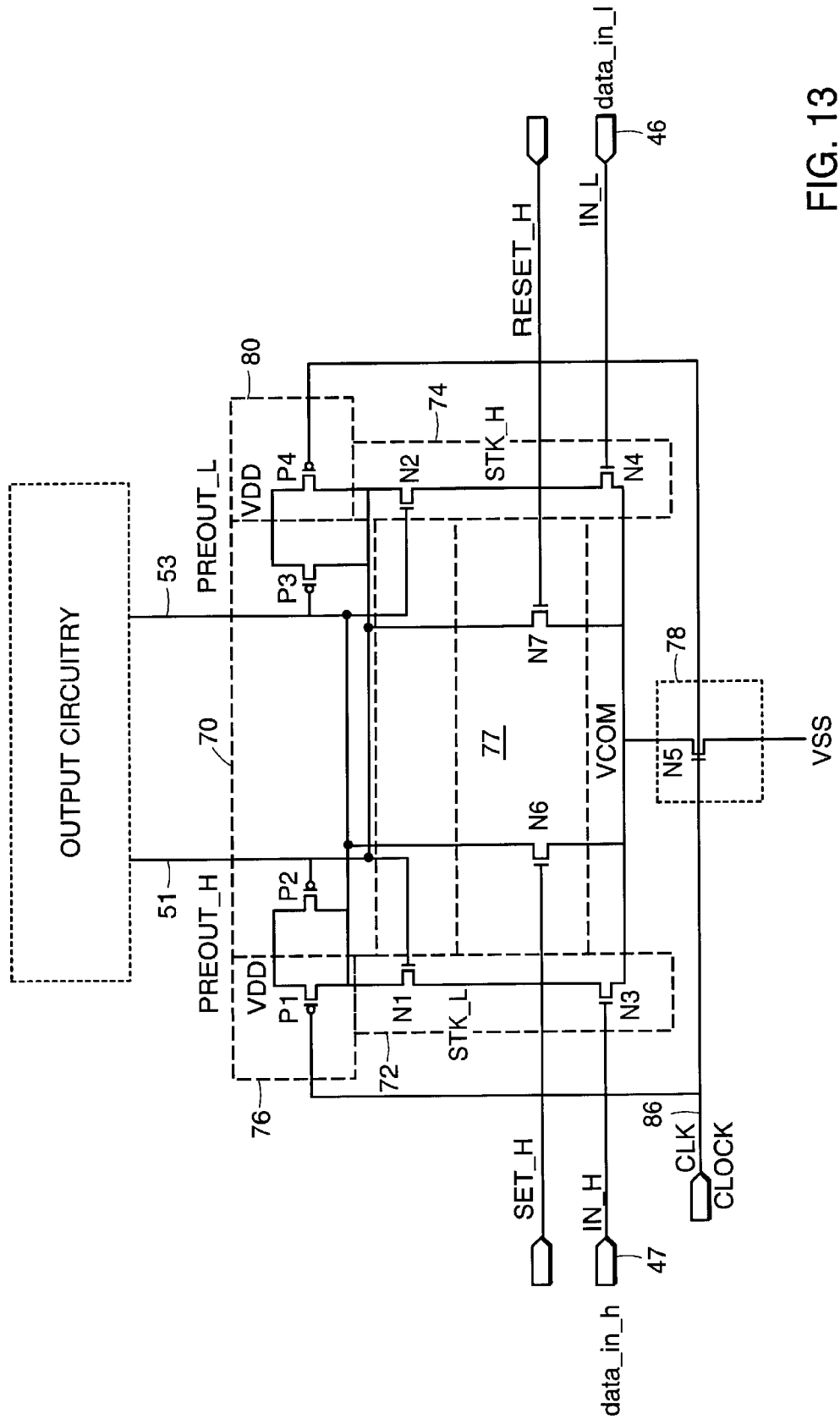
FIG. 13 is a schematic diagram of a still further embodiment of the sense amplifier of FIG. 4, according to the present invention.

Referring now to FIG. 13, a further alternative embodiment of sense amplifier 44 is shown to include a connection between the source terminal of transistor N6 and the drain terminal of PMOS transistor P2 and a connection between the source terminal of transistor N7 and the drain terminal of PMOS transistor P3. The ultimate operation of sense amplifier 44 remains the same in the sense that an assertion of the SET_H or RESET_H signals cause a corresponding assertion or de-assertion of the output signal PREOUT_H. However, in the present circuit configuration transistors N2 N7 and N4 can have the same length and width dimensions. Likewise, transistors N1, N6 and N3 can also have the same length and width dimensions.

Considering transistors N2, N4 and N7, the present circuit configuration causes transistor N7 to have an effective conductance capacity that is twice as large as the series combination of transistors N2 and N4. Since transistors N2 and N4 are the same size as N7 the series combination has an effective resistance that is twice that of N7 and therefore half the conductance capacity. The same effect applies to transistors N1, N3 and N6 wherein the series combination has an effective resistance that is twice that of N6 and therefore half the conductance capacity.

Accordingly, when signal RESET_H is asserted, the amount of charge that can discharge through transistor N7 overrides the effects of the series combination of transistors N2 and N4 (coupled to data_in_1), and the series combination of transistors N1 and N3 (coupled to data_in_h). Hence, regardless of the voltages on signals data_in_1 or data_in_h, output signal PREOUT_H will be discharged to a logic low level. Likewise, when signal SET_H is asserted, the amount of charge that can discharge through transistor N6 overrides the effects of the series combination of transistors N2 and N4, and the series combination of transistors N1 and N3. Hence, regardless of the voltages on signals data_in_1 or data_in_h, output signal PREOUT_L will be discharged to a logic low level while PREOUT_H remains at a logic high level.

When the instant circuit configuration is utilized certain restrictions on signals SET_H and RESET_H should be observed. Specifically, signals SET_H and RESET_H can only change while clock signal 86 is at a logic low level. Otherwise, transistors N6 and N7 could cause output signals PREOUT_L and PREOUT_H to both discharge. In that situation, the output signals are in an invalid state and remain therein until the next pre-charge cycle restores their logic levels.

Figure 14:
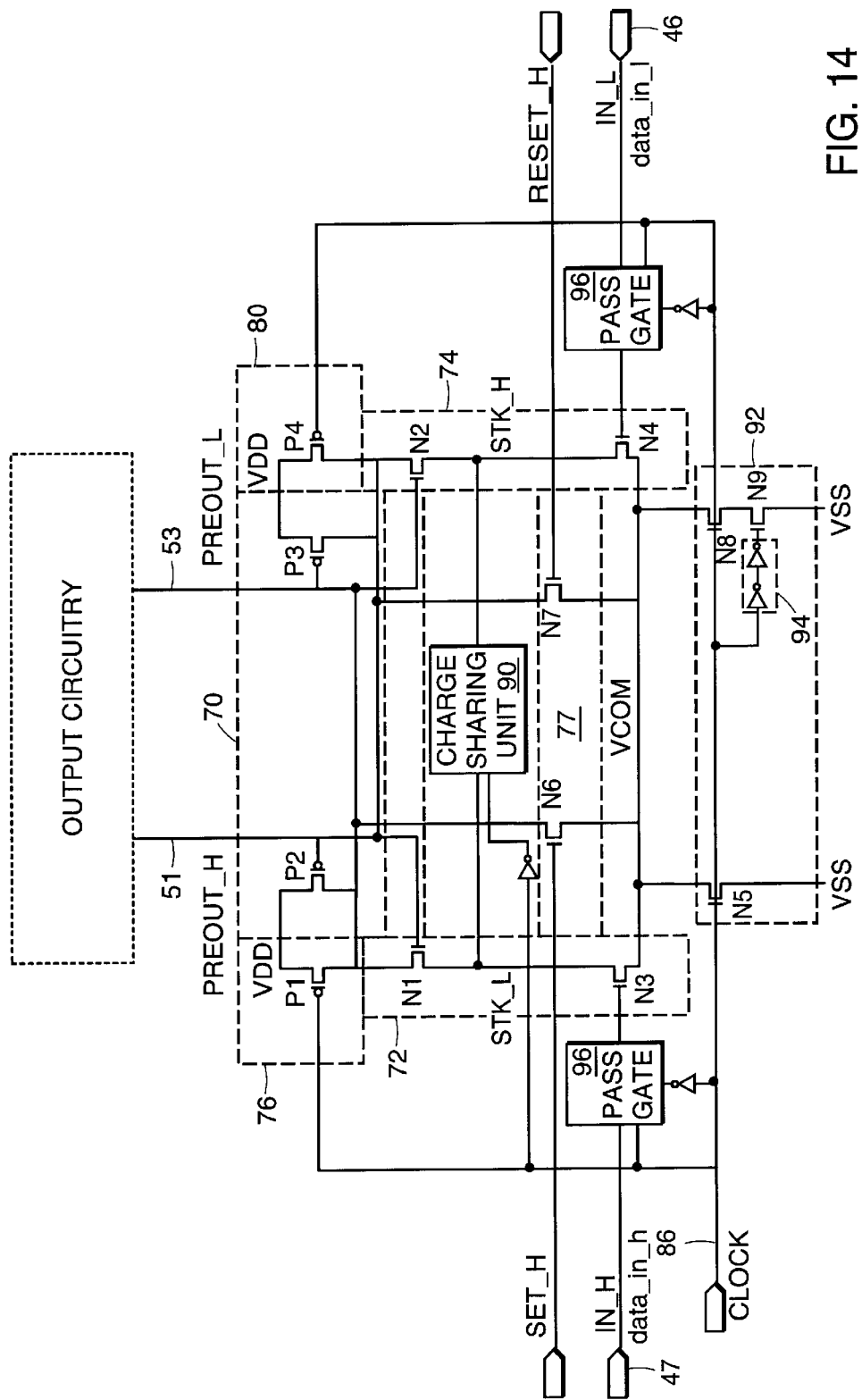
FIG. 14 is a schematic diagram of a still further embodiment of the sense amplifier of FIG. 4, according to the present invention.

It should be noted that the present invention can be incorporated into the sense amplifier described in co-pending Application "A High Input Impedance Strobed CMOS Differential Sense Amplifier With Pre-Evaluate Charge Sharing on Complementary Nodes", invented by Daniel W. Bailey, (Ser. No. 09/241,243 filed on Feb. 1, 1999), and depicted in FIG. 14. Accordingly, a charge sharing unit 90 including a PMOS or NMOS transistor, can be employed between internal signals STK_L and STK_H to balance pre-charge voltage levels, thereby reducing the amount of time required to sense the input signal, IN_H 47.

It should further be noted that the present invention can be incorporated into the sense amplifier described in co-pending Application "A High Input Impedance Strobed CMOS Differential Sense Amplifier With Double Fire Evaluate", invented by Jeff L. Chu, Daniel W. Bailey, and Jason Cantin, (Ser. No. 09/241,003 filed on Feb. 1, 1999) and depicted in FIG. 14. Accordingly, a double-fire evaluate unit 92 can be divided into a number of transistors (e.g., N5, N8, and N9, FIG. 14) that are turned on in a successive manner, where each of the successive transistors has increasing conductance characteristics. With such a structure, the sensitivity of the sense amplifier is increased due to an improved common mode rejection ratio.

It should also be noted that the present invention can be incorporated into the sense amplifier described in co-pending Application "Pass-Gate Inputs That Temporarily Hold State On A High Input Impedance Strobed CMOS Differential Sense Amplifier" invented by Daniel W. Bailey, (Ser. No. 09/241,000 filed on Feb. 1, 1999), and depicted in FIG. 14. Accordingly, the pass-gate input stages 96 can be coupled to the gate terminals of that structure's input transistors. With such a structure, a significant reduction of the data hold timing requirement is provided.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A sense amplifier for sensing a logic level of a first data signal and for outputting representations of that logic level on complementary output terminals, comprising:
   a first discharge path, connected to a first one of said output terminals, for allowing a charge stored on said first one of said output terminals to be discharged at a first rate that is proportional to a voltage level developed on said first data signal;
   a second discharge path, connected to a second one of said output terminals, for allowing a charge stored on said second one of said output terminals to be discharged at a second rate that is proportional to a voltage level developed on a second data signal;
   a set and reset circuit for overriding said discharge of said first one of said output terminals in response to an assertion of a first control signal and for overriding said discharge of said second one of said output terminals in response to an assertion of a second control signal;
   a pre-charge unit coupled to said first and second output terminals to pre-charge said first and second output terminals with the charges; and
   first and second disabling circuits cross-coupled to said second and first discharge paths and in series with said first and second discharge paths, respectively, to disable, as a function of the discharge rates, said first or second output terminal from discharging.

2. A sense amplifier, as described in claim 1, wherein said set and reset circuit sets said first one of said output terminals to a logic high level in response to said assertion of said first control signal, said set and reset circuit having a first conductive path that is turned-on in response to said assertion of said first control signal, said first conductive path being connected in parallel with at least a portion of said first discharge path.

3. A sense amplifier, as described in claim 2, wherein said set and reset circuit resets said first one of said output terminals to a logic low level in response to said assertion of said second control signal, said set and reset circuit having a second conductive path that is turned-on in response to said assertion of said second control signal, said second conductive path being connected in parallel with at least a portion of said second discharge path.

4. A sense amplifier, as described in claim 3, wherein said charge stored on said first one of said output terminals is discharged at a third rate when said second control signal is asserted, said third rate being proportional to a voltage level developed on said second control signal.

5. A sense amplifier, as described in claim 4, wherein said charge stored on said second one of said output terminals is discharged at a fourth rate when said first control signal is asserted, said fourth rate being proportional to a voltage level developed on said first control signal.

6. A sense amplifier, as described in claim 5, wherein said third rate is faster than said second rate responsive to said set and reset circuit having a high conductance characteristic.

7. A sense amplifier, as described in claim 6, wherein said fourth rate is faster than said first rate responsive to said set and reset circuit having said high conductance characteristic.

8. A sense amplifier, as described in claim 7, wherein said set and reset circuit, in response to said assertion of said first control signal, overrides effects imposed on said first discharge path due to said first data signal.

9. A sense amplifier, as described in claim 8, wherein said set and reset circuit, in response to said assertion of said second control signal, overrides effects imposed on said second discharge path due to said second data signal.

10. A sense amplifier, as described in claim 1, wherein said first disabling circuit includes at least a first transistor, having a drain terminal connected to a pull-up unit, providing a path to a voltage supply, and a gate terminal connected to said second one of said output terminals; and
    said first discharge path including a second transistor, having a gate terminal connected to said first data signal and a drain terminal connected in series with a source terminal of said first transistor.

11. A sense amplifier, as described in claim 10, wherein said set and reset circuit comprises a third transistor connected in parallel with said second transistor, said third transistor having a gate terminal connected to said first control signal.

12. A sense amplifier, as described in claim 11, wherein said second disabling circuit includes at least a fourth transistor, having a drain terminal connected to said pull-up unit and a gate terminal connected to said first one of said output terminals; and
    said second discharge path including a fifth transistor, having a gate terminal connected to said second data signal and a drain terminal connected to a source terminal of said fourth transistor.

13. A sense amplifier, as described in claim 12, wherein said set and reset circuit comprises a sixth transistor connected in parallel with said fifth transistor, said sixth transistor having a gate terminal connected to said second control signal.

14. A sense amplifier, as described in claim 13, wherein said third transistor has a larger width to length ratio than said fifth transistor causing effects imposed on said second discharge path due to said second data signal to be overridden by said third transistor.

15. A sense amplifier, as described in claim 13, wherein said sixth transistor has a larger width to length ratio than said second transistor causing effects imposed on said first discharge path due to said first data signal to be overridden by said sixth transistor.

16. A sense amplifier, as described in claim 13, further comprising an evaluate unit, said evaluate unit including an evaluate transistor having a drain terminal connected to said second, third, fifth and sixth transistors and a source terminal connected to an electrical ground.

17. A sense amplifier, as described in claim 16, further comprising:
    a clock signal line, connected to said gate terminal of said evaluate transistor, causing said evaluate transistor to be turned-on in response to a voltage level developed on said clock signal line.

18. A sense amplifier, as described in claim 17, further comprising:
    a first portion of said pull-up unit, coupled to said second one of said output terminals for pulling said second output terminal to a logic high level in response to said first rate being faster than said second rate; and
    a second portion of said pull-up unit, coupled to said first output terminal for pulling said first one of said output terminals to a logic high level in response to said second rate being faster than said first rate.

19. A sense amplifier, as described in claim 16, wherein said evaluate unit includes a plurality of transistors having increasing amounts of conductance and wherein said plurality of transistors are turned on in sequence causing a sensitivity of said sense amplifier to be improved.

20. A sense amplifier, as described in claim 1, further comprising a charge sharing device that allows charges, developed on said first and second discharge paths, to balance in a manner causing the performance of said sense amplifier to improve.

21. A sense amplifier, as described in claim 1, wherein said first data signal is conveyed to said first discharge path through a first pass-gate, coupled to said first discharge path, that latches a logic level of said first data signal causing said sense amplifier to evaluate said first data signal while it is transitioning to a new logic level.

22. A sense amplifier, as described in claim 21, wherein said second data signal is conveyed to said second discharge path through a second pass-gate, coupled to said second discharge path, that latches a logic level of said second data signal causing said sense amplifier to evaluate said second data signal while it is transitioning to a new logic level.

23. A sense amplifier, as described in claim 1, wherein said first and second disabling circuits disable respective output terminals in a manner where the input data signal associated with the disabled output terminal is decoupled from its respective output terminal.

24. A sense amplifier, as described in claim 23, wherein said first one of said output terminals is decoupled from said first data signal by the first disabling circuit when said first discharge rate does not exceed said second discharge rate.

25. A sense amplifier, as described in claim 23, wherein said second one of said output terminals is decoupled from said second data signal by the second disabling circuit when said second discharge rate does not exceed said first discharge rate.

26. A sense amplifier, as described in claim 1, wherein said first and second disabling circuits disable respective output terminals in a manner where said first and second data signals remain coupled to said first and second ones of said output terminals.

27. A sense amplifier for sensing a logic level of a first data signal and for outputting representations of that logic level on complementary output terminals, comprising:

means for setting a first one of said complementary output terminals to a logic high level in response to an assertion of a first control signal;

means for resetting said first one of said complementary output terminals to a logic low level in response to an assertion of a second control signal;

a first discharge means for allowing a charge stored on said first one of said complementary output terminals of said sense amplifier to be discharged at a first rate that is proportional to a voltage level developed on said first control signal when said first control signal is asserted, said discharging of said charge stored on said first one of said complementary output terminals overriding effects imposed on said first one of said complementary output terminals by said first data signal;

a second discharge means for allowing a charge stored on a second one of said complementary output terminals to be discharged at a second rate that is proportional to a voltage level developed on said second control signal when said second control signal is asserted, said discharging of said charge stored on said second one of said complementary output terminals overriding effects imposed on said second one of said complementary output terminals by said second data signal, said first and second discharge means connected by a pull-up unit;

means for pre-charging said complementary output terminals with the charges; and first and second disabling means cross-coupled to said second and first discharge means and in series with said first and second discharge means, respectively, to disable, as a function of the discharge rates, said first or second one of said complementary output terminals from discharging.

28. A sense amplifier, as described in claim 27, wherein said second discharge means discharges said charge stored on said second one of said complementary output terminals at a fourth rate when said first and second control signals are de-asserted, said fourth rate being proportional to a voltage level developed on a second data signal that represents a logic level that is complementary to said logic level of said first data signal.

29. A sense amplifier, as described in claim 28, wherein said first rate is faster than said fourth rate responsive to said setting means and said resetting means having a high conductance characteristic.

30. A sense amplifier as described in claim 29 further comprising an evaluating means for conveying said charges developed on said first and second ones of said complementary output terminals to an electrical ground, through said first and second discharge means.

31. A sense amplifier, as described in claim 30, wherein said set and reset means includes a first conductive path that is turned-on in response to said assertion of said first control signal, said first conductive path being connected in parallel with a portion of said first discharge path causing effects imposed on said first discharge path due to said first data signal to be overridden.

32. A sense amplifier, as described in claim 31, wherein said set and reset means includes a second conductive path that is turned-on in response to said assertion of said second control signal, said first conductive path being connected in parallel with a portion of said second discharge path causing effects imposed on said second discharge path due to said second data signal to be overridden.

33. A sense amplifier, as described in claim 27, wherein said first discharge means discharges said charge stored on said first one of said output terminals at a third rate when said first and second control signals are de-asserted, said third rate being proportional to a voltage level developed on said first data signal.

34. A sense amplifier, as described in claim 33, wherein said second rate is faster than said third rate responsive to said setting means and said resetting means each having a high conductance characteristic.

35. A method for sensing a logic level of a first data signal and for outputting representations of that logic level on complementary output terminals and for setting and resetting those output terminals of a sense amplifier, comprising the steps of:

setting, by a set and reset circuit, a first one of said complementary output terminals to a logic high level in response to an assertion of a first control signal;

resetting, by said set and reset circuit, said first one of said complementary output terminals to a logic low level in response to an assertion of a second control signal, said first control signal and said second control signal not being asserted at the same time;

discharging a charge stored on said first one of said complementary output terminals of said sense amplifier at a first rate that is proportional to a voltage level developed on said first control signal when said first control signal is asserted, said discharging of said charge stored on said first one of said complementary output terminals overriding effects imposed on said first one of said complementary output terminals by said first data signal;

discharging a charge stored on a second one of said complementary output terminals at a second rate that is proportional to a voltage level developed on said second control signal when said second control signal is asserted, said discharging of said charge stored on said second one of said complementary output terminals overriding effects imposed on said second one of said complementary output terminals by a second data signal;

detecting which of said first and second one of said complementary output terminals discharges at a faster rate; and based on which output terminal discharges at a faster rate, disabling the other output terminal from discharging.

36. A method for setting and resetting said complementary output terminals, as described in claim 35, further including the steps of:

discharging said charge stored on said first one of said complementary output terminals at a third rate when said first and second control signals are de-asserted, said third rate being proportional to a voltage level developed on said first data signal; and discharging said charge stored on said second one of said complementary output terminals at a fourth rate when said first and second control signals are de-asserted, said fourth rate being proportional to a voltage level developed on said second data signal that represents a logic level that is complementary to said logic level of said first data signal.

37. A method for setting and resetting said output terminals, as described in claim 36, wherein said first rate is faster than said fourth rate responsive to said setting and said resetting.

38. A method for setting and resetting said output terminals, as described in claim 37, further comprising the steps of:

turning-on an evaluate unit in response to an assertion of a clocking signal such that a path is provided for said discharging steps to discharge said charge developed on said first and second output terminals to an electrical ground; and conveying said charges developed on said first and second output terminals to said electrical ground, through said evaluate unit in response to said assertion of said clocking signal.

39. A method for setting and resetting said output terminals, as described in claim 38, wherein said set and reset circuit includes a first conductive path that is turned-on in response to said assertion of said first control signal, said first conductive path being connected in parallel with a portion of said first discharge path causing effects imposed on said first discharge path due to said first data signal to be overridden.

40. A method for setting and resetting said output terminals, as described in claim 39, wherein said set and reset circuit includes a second conductive path that is turned-on in response to said assertion of said second control signal, said second conductive path being connected in parallel with a portion of said second discharge path causing effects imposed on said second discharge path due to said second data signal to be overridden.

41. A method for setting and resetting said output terminals, as described in claim 36, wherein said second rate is faster than said third rate responsive to said setting means and said resetting means each having a high conductance characteristic.

42. A sense amplifier for sensing a logic level of a first data signal and for outputting representations of that logic level on complementary output terminals, comprising:

a first discharge path, connected to a first one of said output terminals, for allowing a charge stored on that first output terminal to be discharged at a first rate that is proportional to a voltage level developed on said first data signal;

a second discharge path, connected to a second one of said output terminals, for allowing a charge stored on that second one of said output terminals to be discharged at a second rate that is proportional to a voltage level developed on a second data signal; and a circuit for overriding said discharge of said first one of said output terminals in response to an assertion of a first control signal;

a pre-charge circuit to pre-charge said first and second ones of said output terminals; and first and second disabling circuits cross-coupled to said second and first discharge paths and in series with said first and second discharge paths, respectively, to disable, as a function of the discharge rates, said first or second one of said output terminals from discharging.

43. A sense amplifier, as described in claim 42, wherein said circuit sets said first one of said output terminals to a logic high level in response to said assertion of said first control signal, said circuit having a first conductive path that is turned-on in response to said assertion of said first control signal, said first conductive path being connected in parallel with at least a portion of said first discharge path.

44. A sense amplifier, as described in claim 43, wherein said charge stored on said first one of said output terminals is discharged at a third rate that is proportional to a voltage level developed on said first control signal when said first control signal is asserted.

45. A sense amplifier, as described in claim 44, wherein said third rate is faster than said first rate responsive to said circuit having a high conductance characteristic.

* * * * *